United States Patent [19]

Shafer et al.

[11] Patent Number: 5,161,062

[45] Date of Patent: Nov. 3, 1992

[54] OPTICAL PROJECTION SYSTEM INCLUDING A REFRACTIVE LENS ASSEMBLY HAVING A GAP BETWEEN CONSTITUENT LENSES

[75] Inventors: David Shafer, Fairfield, Conn.; Ian Powell, Gloucester, Canada

[73] Assignee: General Signal Corporation, Stamford, Conn.

[21] Appl. No.: 728,343

[22] Filed: Jul. 11, 1991

[51] Int. Cl.$^5$ .............................. G02B 17/00
[52] U.S. Cl. .................... 359/785; 359/795
[58] Field of Search ............... 359/794, 793, 785, 784, 359/795

[56] References Cited

U.S. PATENT DOCUMENTS

4,964,704 10/1990 Shinohara .......................... 359/784
5,040,882  8/1991 Markle ............................... 358/732

*Primary Examiner*—Constantine Hannaher
*Assistant Examiner*—Don Wong
*Attorney, Agent, or Firm*—John F. Ohlandt; Raymond E. Smiley

[57] ABSTRACT

A photolithographic projection optical system comprising: a source of exposure energy for generating a beam of energy; an optical element located in the path of the beam for receiving the beam of energy and passing the beam therethrough; a refractive lens assembly located in the path of the portion of the beam for receiving and transmitting the beam of energy, the refractive lens assembly comprising at least one meniscus lens, a plano-convex lens, and an air gap disposed between the meniscus lens and the plano-convex lens; a reticle element located in the path of the portion of the beam, the reticle element having a uniform thickness and being positioned for permitting the beam to pass through the thickness and through the lens assembly to the optical element. Alternatively, the air gap of the refractive lens assembly can be replaced with a glass layer having an index of refraction that is lower than both the meniscus lens and the plano-convex lens.

18 Claims, 5 Drawing Sheets

OPTICAL PROJECTION SYSTEM INCLUDING A REFRACTIVE LENS ASSEMBLY HAVING A GAP BETWEEN CONSTITUENT LENSES

This invention relates generally to an apparatus for microlithographically forming image patterns on semiconductor wafers and, more particularly, to an improved system for one-to-one projection of image patterns on to a predetermined focal plane, wherein at least one monocentric air gap or specially designed glass layer is disposed between a meniscus lens and a plano-convex lens of the refractive lens assembly of the system, resulting in both monochromatic and chromatic correction of higher order aberrations. Alternatively, the present invention may also include multiple air gaps disposed throughout the refractive lens assembly.

BACKGROUND OF THE INVENTION

The fabrication of integrated circuits requires a method for accurately forming the circuit-defining image patterns on a semiconductor wafer. A photoengraving process know as photolithography, or simply masking, is widely employed for this purpose. The microelectronic circuit is built up layer by layer, each layer being based on a particular image pattern received from a photolithographic mask. Such masks typically comprise a glass plate approximately the size of a wafer, the plate having a single pattern repeated many times over its surface. Each repeated pattern corresponds to a pattern to be imposed upon a layer of a wafer.

The mask patterns are derived from an optical reticle having a primary pattern which may be generated by a computer controlled light spot or electron beam which is scanned across a photosensitive plate. In early systems involving masks, the reticle patterns were typically ten times the final size of the pattern to be imposed on the wafer. An image one-tenth the size of the reticle pattern was projected optically on the final mask, such reticle pattern being reproduced side by side many times on the mask in a step-and-repeat process. Thereafter, the mask patterns were transferred in a number of ways to wafers, for example, by optical projection scanners.

In later-developed unit magnification scanners systems, full size, multiple pattern masks have been eliminated to a great extent because it has become possible to repetitively align and focus on to a small wafer a reticle pattern the same scale as the final pattern. However, some problems remain in applying such systems.

U.S. Pat. No. 4,391,494 (Hershel), which issued on Jul. 5, 1983, discloses an apparatus which substantially improved upon the resolution of the above-mentioned projection scanners. The apparatus according to Hershel projected an image of a reticle pattern onto a wafer with one-to-one magnification.

Figure 1:
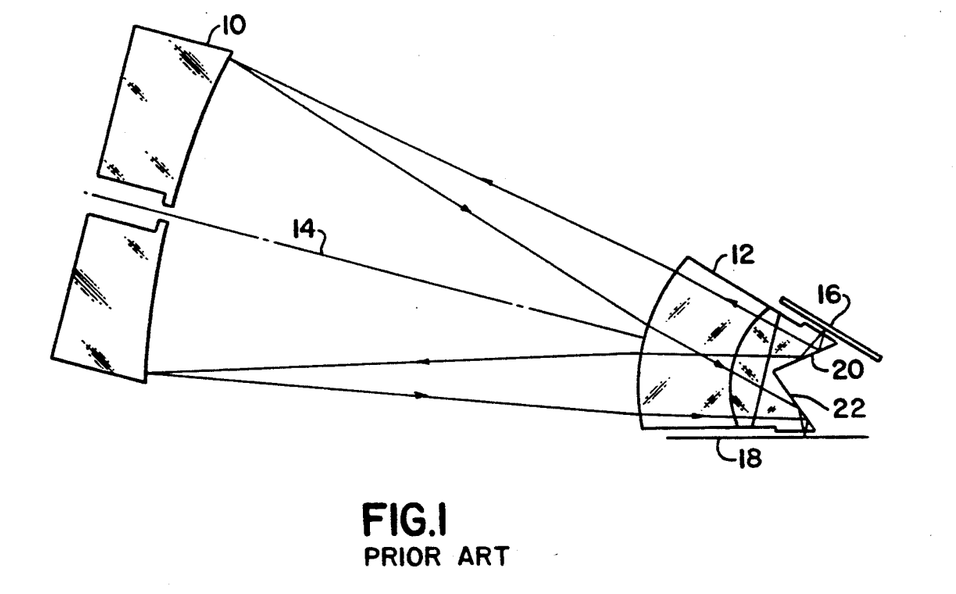
FIG. 1 is a schematic representation of a conventional projection system and fiducial marker detection system of a projection stepper capable of projecting an image of a reticle pattern onto a wafer, with one-to-one magnification.

A schematic representation of the Hershel apparatus is attached hereto as FIG. 1 which includes a mirror 10 and a composite achromat-prism assembly 12 which are disposed symmetrically about an optical axis 14. The reticle pattern plane 16 lies on one side of the axis 14 and the wafer image or object plane 18 lies on the opposite side. The prisms 20 and 22 couple light into and out of the optical system and separate the reticle plane 16 from the horizontal wafer plane 18. An air gap between the reticle plane 16 and the prism 20 and the wafer plane 18 and the prism 22 provide sufficient mechanical clearance and space for movement of a wafer and a reticle into and out of the respective wafer image plane 18 and reticle pattern plane 16. This system has proved quite advantageous and useful with systems of moderate to low numerical aperture (NA). However, because of the use of prisms 20 and 22 the system inherently includes a certain amount of field which is lost due to vignetting that is dependent on numerical aperture.

The system described in the Hershel patent is a unit magnification achromatic anastigmatic optical projection system that uses both reflective and refractive elements in a complementary fashion to achieve large field sizes and high numerical apertures. The system is basically symmetrical, thus eliminating all aberrations of odd order such as, distortion and lateral color. All of the spherical surfaces are nearly concentric with the centers of curvature located close to the focal plane. Thus, the resultant system is essentially independent of the index of refraction of the air in the lens, making pressure compensation unnecessary. However, in order to attain sufficient working space for movement of the reticle and wafer, the object and image planes of this system are separated through the use of two symmetrical folding prisms. The cost of this gain in working space is the reduction of available field size to about 25% to 35% of the total potential field.

With the increasing demand for higher resolution capabilities from such systems, a system capable of even higher numerical apertures and higher resolution with acceptable field size was developed. This system is disclosed in U.S. Pat. No. 4,964,705 (Markle), which issued on Oct. 23, 1990. The system disclosed in the Markle patent utilizes nearly 50% of the total field to create an image on a wafer. By sacrificing the remaining 50% higher numerical apertures and higher resolutions can be obtained while maintaining acceptable field size.

Figure 2:
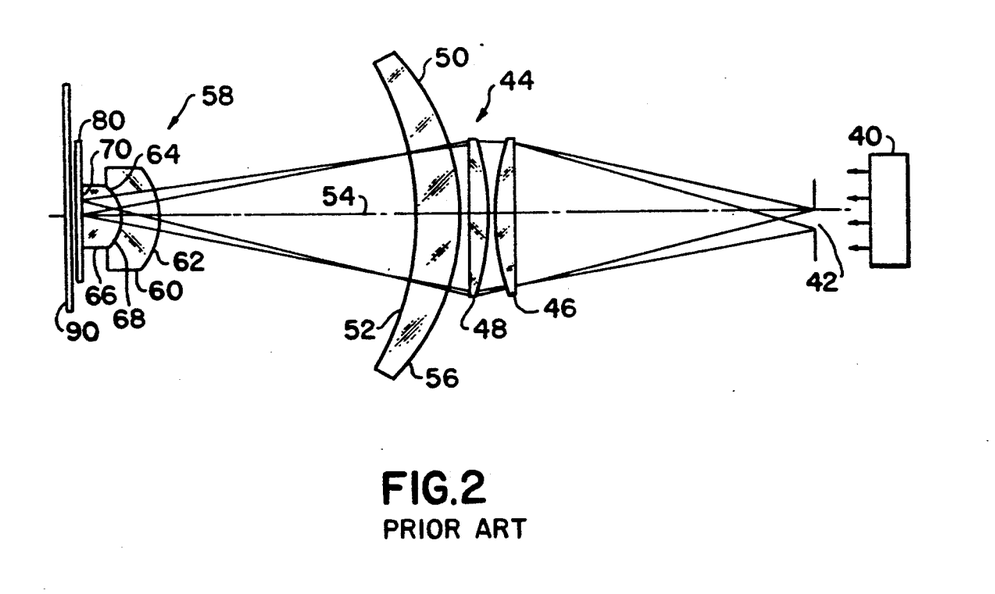
FIG. 2 is a schematic representation of a conventional unit magnification optical projection system particularly suited for use in microlithography wherein the field size is nearly half of the total possible theoretical field size afforded by the numerical aperture of the system.

The Markle unit magnification optical system is depicted in FIG. 2, attached hereto, wherein a source of exposure energy 40 generates a beam of energy which is directed through an aperture 42 to a relay 44 which, for example, may be comprised of a plano-concave element 46 and a plano-convex element 48. The converging illumination beam is then directed through a primary meniscus lens 50 having a partially reflective surface 52. Relay 44 and primary lens-mirror (50,52) are symmetrically disposed about an optical axis 54. The primary lens is preferably made of fused silica and includes a first surface 56 closest to relay 44 and the source of exposure energy 40 in addition to the partially reflective surface 52. That portion of beam 40 which passes through surface 52 is directed to a refractive lens assembly or group 58 for receiving and transmitting that portion of the beam of energy. The refractive lens assembly 58 preferably includes at least a meniscus lens 60 made from a material having a relatively high index of refraction, for example, fused silica or barium fluoride. The lens 60 has a first convex surface 62 facing the primary lens 50 and a concave surface 64 facing away from the primary lens 50. The refractive lens assembly 58 further includes a plano-convex lens 66 preferably made from a material having a lower index of refraction and a lower dispersive power than meniscus lens 60, for example, lithium fluoride and has a convex surface 68 facing the concave surface 64 and a flat or nearly flat surface 70 facing away from the primary lens-mirror (50, 52). A reticle element 80 is positioned in close proximity to the flat surface 70 of plano-convex lens 66. A wafer 90 is positioned parallel to and in close proximity to reticle element 80.

The aforementioned monocentric system exhibits aberrations due to spherical aberration and color of the chief ray. These monocentric afocal systems with the object and image at the common center of curvature have only the aberration of higher order astigmatism. That is corrected to one order higher than the departure of the chief ray from afocality. If the design is paraxially afocal (i.e., corrected for afocality to the 1st-order) then 3rd-order astigmatism and Petzval curvature are corrected. If it is only paraxially afocal for one wavelength because of longitudinal color of the chief ray, then the 3rd-order astigmatism and Petzval curvature will change with wavelength.

If the system is afocal at the 3rd-order level, as well as paraxially, due to 3rd-order spherical aberration of the chief ray being corrected, then 5th-order astigmatism and Petzval curvature are also corrected. If there is spherochromatism of the chief ray (i.e., variation of spherical aberration with wavelength), then 5th-order astigmatism and Petzval curvature will change with wavelength.

If the 5th-order spherical aberration of the chief ray is corrected, then 7th-order astigmatism and Petzval curvature are also corrected, and so on.

The designs in FIGS. 1 and 2 above correct the longitudinal color and the 3rd-order spherical aberration of the chief ray. This is accomplished by introducing a cemented monocentric surface with two different glasses on either side of the refractive lens assemblies. The dispersion difference between the two glasses corrects the longitudinal color of the chief ray, while the index difference corrects 3rd-order spherical aberration of the chief ray. As the index difference is made less, the required dispersion difference also becomes less. Due to their chief ray properties, these conventional designs can be corrected for chromatic variation in 3rd-order astigmatism and Petzval curvature as well as the monochromatic 5th-order aberrations.

In fact, this is almost never done since it is always better to balance out the uncorrectable higher order aberrations by introducing compensating amounts of the lower order aberrations which can be controlled. In this case, the longitudinal color of the chief ray in the conventional designs is only partially corrected, so as to balance some intentional residual color against the uncorrectable chief ray spherochromatism (i.e., chromatic variation of spherical aberration) of the design. In a like manner, 3rd-order spherical aberration of the chief ray is only partially corrected so as to balance some of it against the uncorrectable 5th-order spherical aberration of the chief ray.

The present inventors have developed a unique configuration of the refractive lens group or assembly of the unit magnification optical system which utilizes a gap, preferably an air gap, disposed between a meniscus lens and a closely spaced plano-convex lens of the lens group, thereby to improve both the monochromatic correction and the chromatic correction of the system. Such improvement is directed to a principal drawback of previously known arrangements. With two different lens materials, it is possible in a design with cemented lenses to correct either higher order astigmatisms or chromatic variation of astigmatism, but not both, unless the lens materials have a particular relationship to each other. Most lens materials cannot exactly satisfy that relationship, so there is a compromise made and performance suffers. With the addition of a small air gap to the design, many lens material pairs can be found with the right relationship, allowing correction of both higher order astigmatisms and chromatic variation of astigmatism.

The present invention involves several modifications to the refractive lens assembly which substantially improve the imaging performance of the unit magnification optical system. These modifications include the use of more than one meniscus air gap in the refractive lens assembly, which result in correction of higher order aberrations and enhance the performance of the system. For example, the present invention permits correction to all the monochromatic 3rd, 5th, 7th, 9th and 11th-order aberrations in field and aperture.

The present invention also provides many additional advantages which shall become apparent as described below.

SUMMARY OF THE INVENTION

A photolithographic projection optical system comprising: a source of exposure energy for generating a beam of energy; an optical element located in the path of said beam for receiving said beam of energy and passing a portion of said beam therethrough; a refractive lens assembly located in the path of said portion of said beam for receiving and transmitting said beam of energy; a reticle element located in the path of said beam, said reticle element having a uniform thickness, said reticle element being positioned for permitting said beam to pass through said thickness and said lens assembly to said optical element, wherein the improvement comprises: said refractive lens assembly comprising at least one meniscus lens, a plano-convex lens, said lenses being disposed to have substantially concentric, confronting surfaces; and a monocentric gap for achieving spherical aberration correction, said gap being essentially defined by the close spacing between said substantially concentric, confronting surfaces of said meniscus lens and said plano-convex lens.

Alternatively, the air gap of the refractive lens assembly can be replaced with a glass layer having an index of refraction that is lower than both the meniscus lens and the plano-convex lens.

The air gap of the refractive lens assembly is substantially concentric or monocentric. The plano-convex lens is typically composed of either calcium fluoride or lithium fluoride, and the meniscus lenses are typically fused silica. For these materials, the air gap has a preferred width in the range of about 40 to 60 microns, such air gap dimensions being varied in accordance with other selected materials.

In accordance with another object of the present invention, the refractive lens assembly may comprise a first meniscus lens, a plano-convex lens, a second meniscus lens disposed between the first meniscus lens and the plano-convex lens, a first air gap disposed between the second meniscus lens and the plano-convex lens, and a second air gap disposed between the first meniscus lens and the second meniscus lens. Alternatively, the first air gap may be replaced with a glass layer having an index of refraction that is lower than both the second meniscus lens and the plano-convex lens. Similarly, the second air gap may be replaced with a glass layer having an index of refraction that is lower than both the first meniscus lens and the second meniscus lens.

In accordance with still another object of the present invention, the refractive lens assembly may comprise a first meniscus lens, a plano-convex lens, a second meniscus lens disposed between the first meniscus lens and the plano-convex lens, an air gap disposed between the first meniscus lens and the second meniscus lens, and wherein the second meniscus lens is affixed to the plano-convex lens. Alternatively, the air gap may be replaced with a glass layer having an index of refraction that is lower than both the first meniscus lens and the second meniscus lens. In this embodiment the second meniscus lens is typically affixed to the plano-convex lens by cementing.

Another object of the present invention is a method of projecting an image in a photolithographic process comprising: generating a beam of energy from a source of exposure energy; passing a portion of the energy beam through an optical element, a refractive lens assembly comprising at least one meniscus lens, a plano-convex lens, and an air gap disposed between the meniscus lens and the plano-convex lens, and a reticle element having a reflective pattern on one surface thereof, and an unpatterned portion adjacent thereto; reflecting the portion of the energy beam off the reflective pattern on the reticle element; passing the reflective beam through the reticle element and the refractive lens assembly; and reflecting a portion of the reflected beam off the optical element and through the refractive lens assembly and the unpatterned portion of the reticle element to a surface on which the pattern is to be imaged.

The refractive lens assembly according to the above method may alternatively comprise a first meniscus lens, a plano-convex lens, a second meniscus lens disposed between the first meniscus lens and the plano-convex lens, a first air gap disposed between the second meniscus lens and the plano-convex lens, and a second air gap disposed between the first meniscus lens and the second meniscus lens.

In accordance with another embodiment, the above method may also comprise a refractive lens assembly comprising a first meniscus lens, a plano-convex lens, a second meniscus lens disposed between the first meniscus lens and the plano-convex lens, an air gap disposed between the first meniscus lens and the second meniscus lens, and wherein the second meniscus lens is affixed to the plano-convex lens.

Other and further objects, advantages and features of the present invention will be understood by reference to the following specification in conjunction with the annexed drawings, wherein like parts have been given like numbers.

DESCRIPTION OF THE PREFERRED EMBODIMENTS

Figure 3A:
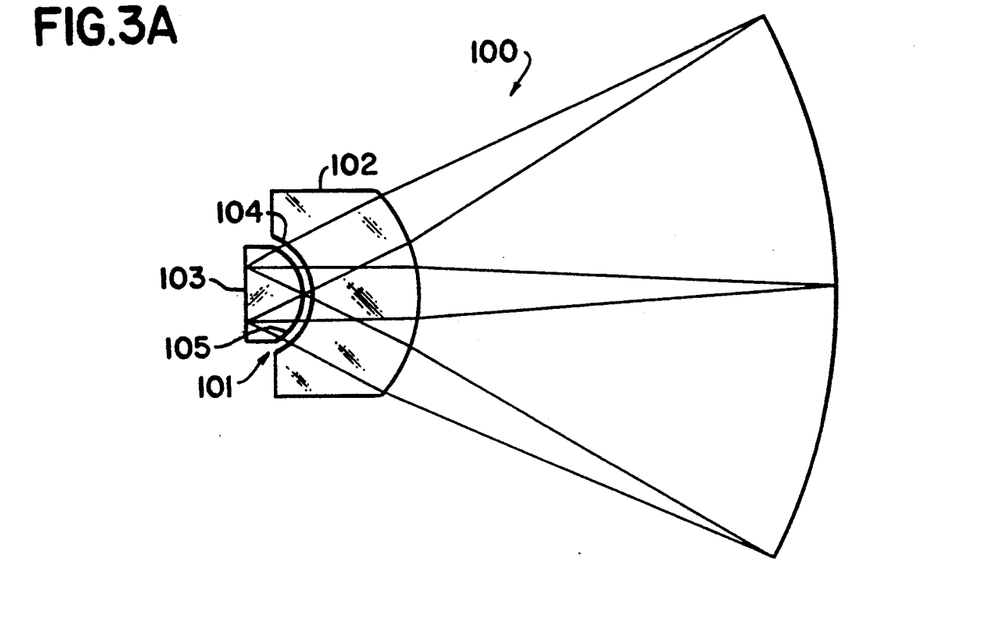
FIG. 3A is a schematic representation of a partial optical system comprising an air gap disposed between the meniscus lens and plano-convex lens of the refractive lens assembly of a unit magnification optical projection system according to the present invention.
Figure 3B:
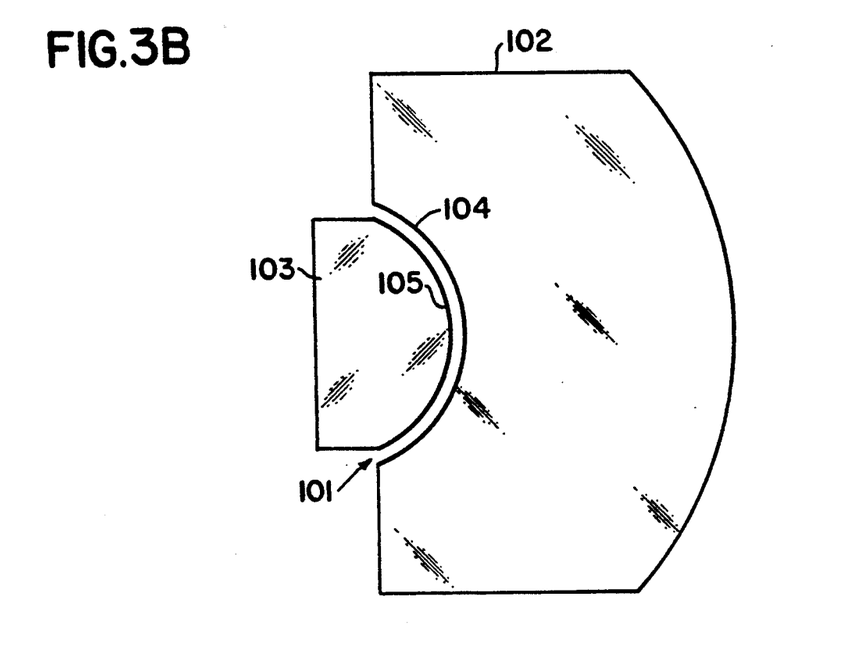
FIG. 3B is a schematic representation of the air gap disposed between the meniscus lens and plano-convex lens of the refractive lens assembly of a unit magnification optical projection system according to the FIG. 3A.

The present invention can best be described by referring to the attached drawings, wherein FIGS. 3A and 3B depict a schematic representation of a partial optical system 100 comprising an air gap 101 disposed between a meniscus lens 102 and plano-convex lens 103 of the refractive lens assembly of a unit magnification optical projection system according to the present invention. Air gap 101 is typically disposed between a concave surface 104 of meniscus lens 102 and a convex surface 105 of plano-convex lens 103. Air gap 101 preferably has a width in the range between about 40 to 60 microns for the specific materials under discussion.

By adding small monocentric air gap 101 between meniscus lens 102 and plano-convex lens 103, it is possible to correct 5th-order spherical aberration of the chief ray, which then leads to the unit magnification optical projection system being corrected for 7th-order astigmatism and Petzval curvature.

Figure 7:
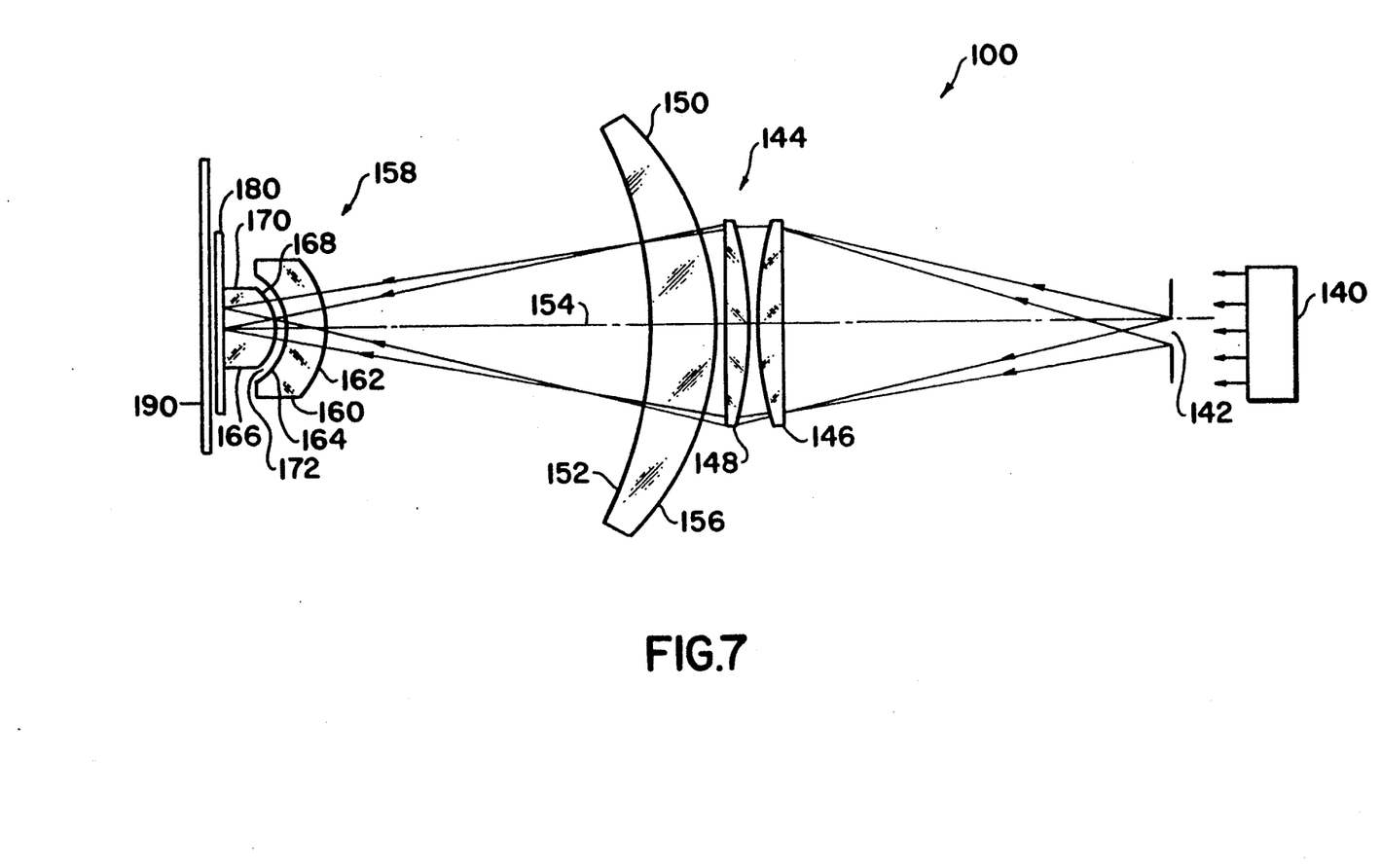
FIG. 7 is a schematic representation of a unit magnification optical projection system comprising a refractive lens assembly having an air gap disposed therein.

The novel refractive lens assembly according to FIGS. 3A and 3B above, are primarily used in a unit magnification optical projection system as set forth in FIG. 7, attached hereto. FIG. 7 depicts a unit magnification optical system 100 comprising a source of exposure energy 140 which generates a beam of energy directed through an aperture 142 to a relay 144 which, for example, may be comprised of a plano-concave element 146 and a plano-convex element 148. The converging illumination beam is then directed through a primary meniscus lens 150 having a partially reflective surface 152. Relay 144 and primary lens-mirror (150, 152) (i.e., optical element) are symmetrically disposed about an optical axis 154. The primary lens 150 is preferably made of fused silica and includes a first surface 156 closest to relay 144 and the source of exposure energy 140 in addition to the partially reflective surface 152.

That portion of beam 140 which passes through surface 152 is directed to a refractive lens assembly or group 158 for receiving and transmitting that portion of the beam of energy. The refractive lens assembly 158 preferably includes at least a meniscus lens 160 made from a material having a relatively high index of refraction, for example, fused silica or barium fluoride. Meniscus lens 160 has a first convex surface 162 facing the primary lens 150 and a concave surface 164 facing away from the primary lens 150. The refractive lens assembly 158 further includes a plano-convex lens 166 preferably made from a material having a lower index of refraction and a lower dispersive power than meniscus lens 160, for example, lithium fluoride or calcium fluoride and has a convex surface 168 facing concave surface 164 and a flat or nearly flat surface 170 facing away from the primary lens-mirror (150, 152). An air gap 172 is disposed between concave surface 164 of meniscus lens 160 and convex surface 168 of plano-convex lens 166. A reticle element 180 is positioned in close proximity to the flat surface 170 of plano-convex lens 166. A wafer 190 is positioned parallel to and in close proximity to reticle element 180.

One preferred method of projecting an image in a photolithographic process according to the present invention comprises: generating a beam of energy from a source of exposure energy 140; passing a portion of the energy beam through an optical element, i.e., primary lens 150 and mirror 152, a refractive lens assembly 158 comprising at least one meniscus lens 160, a plano-convex lens 166, and an air gap 172 disposed between meniscus lens 160 and plano-convex lens 166, and a reticle element 180 having a reflective pattern on one surface thereof, and an unpatterned portion adjacent thereto; reflecting the portion of the energy beam off the reflective pattern on reticle element 180; passing the reflective beam through reticle element 180 and refractive lens assembly 158; and reflecting a portion of the reflected beam off primary lens 150 and mirror 152 and through refractive lens assembly 158 and the unpatterned portion of reticle element 180 to a surface on which the pattern is to be imaged.

Figure 4:
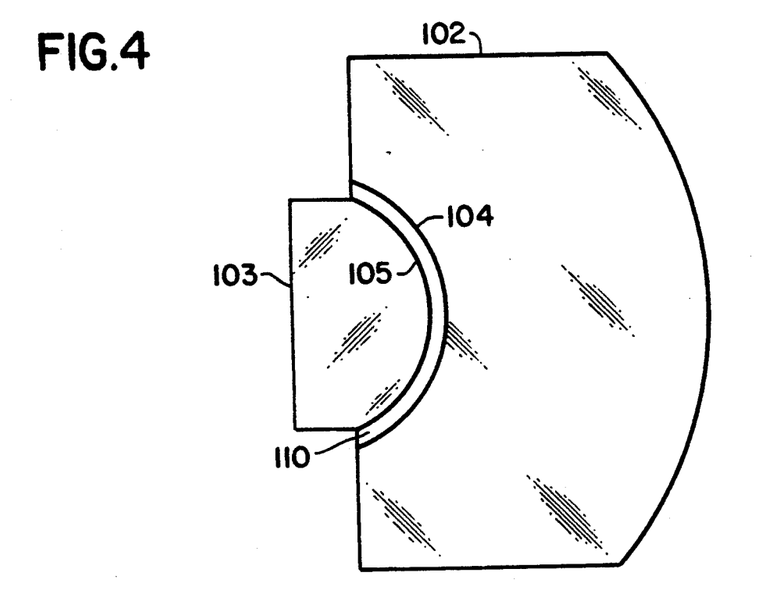
FIG. 4 is a schematic representation wherein a low index of refraction glass is disposed between the meniscus lens and plano-convex lens of the refractive lens assembly of a unit magnification optical projection system according to another embodiment of the present invention.

As shown in FIG. 4, the monocentric air gap can be replaced with a glass layer 110 comprising any glass having an index of refraction that is lower than both meniscus lens 102 and plano-convex lens 103. In this case, glass layer 110 is substantially thicker than the very thin air gap that it replaced. It is believed that glass layer 110 would reduce reflection losses, reduce surface figure accuracy requirements, and give a mechanically stable cemented system. The spherochromatism of the chief ray does not change much as different glass combinations are tried, unless a very large index difference is used, e.g., 0.6 mm. It can be corrected if glasses at the complete opposite ends of the glass chart are used.

Figure 6:
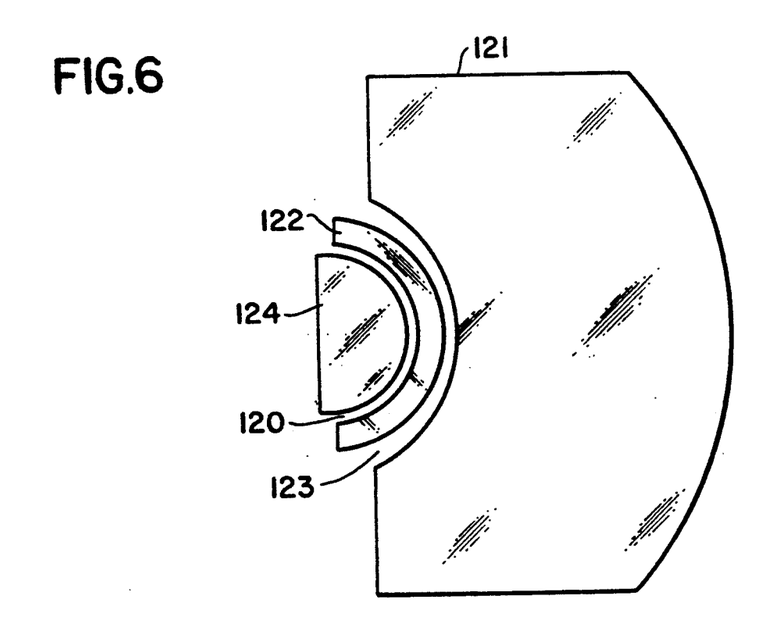
FIG. 6 is a schematic representation of a partial optical system of another embodiment according to the present invention which comprises multile air gaps disposed throughout the refractive lens assembly, e.g., between a first meniscus lens and a second meniscus lens, and between the second meniscus lens and a plano-convex lens.

By adding multiple air gaps into the refractive lens assembly, higher orders of spherical aberration of the chief ray can be corrected. FIG. 6 shows one such multiple air gap configuration wherein 7th-order spherical aberration of the chief ray is corrected, meaning that 9th-order astigmatism and Petzval curvature is then corrected. Preferably, only two types of glass are used in the multiple air gap refractive lens assemblies. As shown in FIG. 6, a first air gap 120 is disposed between second meniscus lens 122 and plano-convex lens 124, and a second air gap 123 is disposed between first meniscus lens 121 and second meniscus lens 122. First air gap 120 is always positioned at the previously cemented interface of the refractive lens assembly, i.e., between plano-convex lens 124 and adjoining meniscus lens 122. The additional air gaps can be disposed anywhere throughout the refractive lens assembly which permits substantial configuration flexibility.

For example, one configuration is to choose a position and thickness of the second air gap so that 9th-order spherical aberration of the chief ray is also corrected. That lead to 11th-order astigmatism and Petzval curvature also being corrected. Another application would be to use the multiple air gaps and the glass index difference to correct spherochromatism of the chief ray and also 5th-order spherical aberration of the chief ray.

Figure 5A:
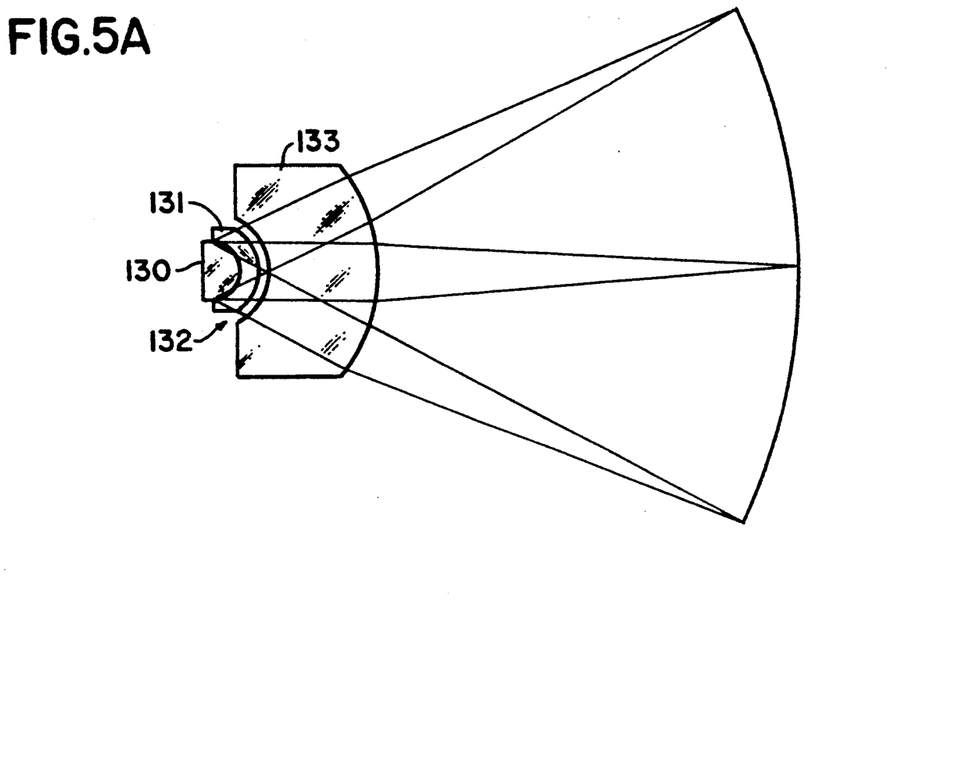
FIG. 5A is a schematic representation of a partial optical system of another embodiment according to the present invention which comprises an air gap disposed between a first meniscus lens and a second meniscus lens, in conjunction with a conventional refractive lens assembly wherein the second meniscus lens is cemented to a plano-convex lens.
Figure 5B:
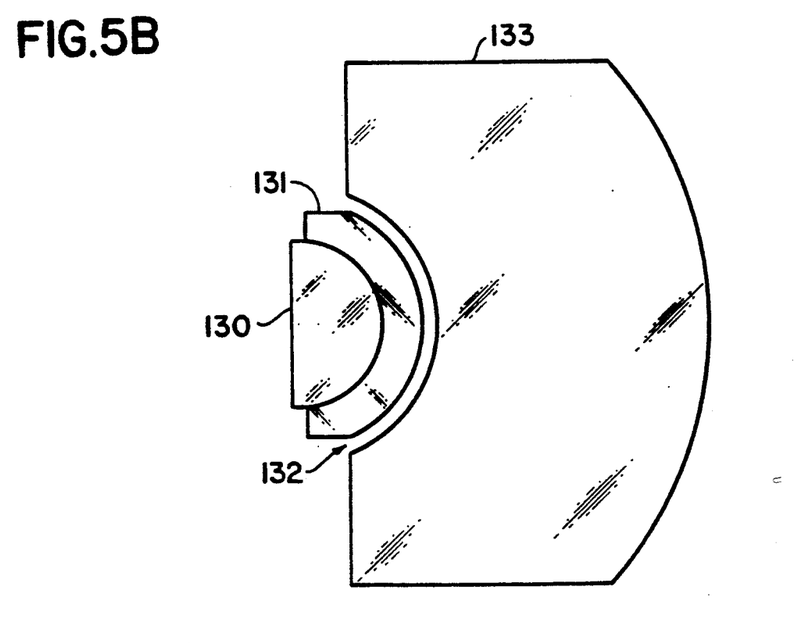
FIG. 5B is a schematic representation of the air gap disposed between the first and second meniscus lenses, and a conventional refractive lens assembly of a unit magnification optical projection system according to FIG. 5A.

FIGS. 5A and 5B depict another embodiment according to the present invention, wherein a plano-convex lens 131 is cemented to a second meniscus lens 131, and an air gap 132 is disposed between second meniscus lens 131 and first meniscus lens 133. The air gap thickness and position can be determined to meet the specific needs of the optical system. For example, the air gap can be positioned such that the 5th and 7th-order spherical aberration of the chief ray is corrected.

Any or all of the air gaps in the refractive lens assemblies according to the present invention can be replaced with a glass layer having a glass material which has a lower index of refraction than any of the lens juxtaposed with the respective air gap.

While we have shown and described several embodiments in accordance with our invention, it is to be clearly understood that the same are susceptible to numerous changes apparent to one skilled in the art. Therefore, we do not wish to be limited to the details shown and described but intend to show all changes and modifications which come within the scope of the appended claims.

What is claimed is:

1. A photolithographic projection optical system comprising: a source of exposure energy for generating a beam of energy; an optical element located in the path of said beam for receiving said beam of energy and passing a portion of said beam therethrough; a refractive lens assembly located in the path of said portion of said beam for receiving and transmitting said beam of energy; a reticle element located in the path of said beam, said reticle element having a uniform thickness, said reticle element being positioned for permitting said beam to pass through said thickness and said lens assembly to said optical element, wherein the improvement comprises:

said refractive lens assembly comprising at least one meniscus lens, a plano-convex lens, said lenses being disposed to have substantially concentric, confronting surfaces; and a monocentric gap for achieving spherical aberration correction, said gap being essentially defined by the close spacing between said substantially concentric, confronting surfaces of said meniscus lens and said plano-convex lens.

2. The system according to claim 1, wherein said gap is an air gap.

3. The system according to claim 1, wherein said gap has a width in the range between about 40 to 60 micrometers.

4. The system according to claim 1, wherein said optical system is a unit magnification system.

5. The system according to claim 1, wherein said plano-convex lens is calcium fluoride.

6. The system according to claim 1, wherein said plano-convex lens is lithium fluoride.

7. The system according to claim 1, wherein said meniscus lens is fused silica.

8. The system according to claim 1, wherein said gap is filled with a glass layer having an index of refraction that is lower than both said meniscus lens and said plano-convex lens.

9. A photolithographic projection optical system comprising: a source of exposure energy for generating a beam of energy; an optical element located in the path of said beam for receiving said beam of energy and passing only a portion of said beam therethrough; a refractive lens assembly located in the path of said portion of said beam for receiving and transmitting said portion of said beam of energy; a reticle element located in the path of said portion of said beam, said reticle element having a uniform thickness and having a pattern on one surface thereof, and an unpatterned portion adjacent thereto, said reticle element being positioned for permitting said portion of said beam to pass through said thickness and for reflecting said portion of said beam through said thickness, and said lens assembly to said optical element; and said optical element receiving said reflected beam and including means for reflecting a portion of said reflected beam back through said lens assembly and said unpatterned portion of said reticle element to a surface to be imaged, wherein the improvement comprises:

said refractive lens assembly comprising a first meniscus lens, a plano-convex lens, a second meniscus lens disposed between said first meniscus lens and said plano-convex lens, said lenses being disposed to have substantially concentric, confronting surfaces, a first monocentric gap for achieving spherical aberration correction, disposed between said second meniscus lens and said plano-convex lens, and a second monocentric gap for achieving spherical aberration correction, disposed between said first meniscus lens and said second meniscus lens, said gaps being essentially defined by the close spacing between said respective, substantially concentric, confronting surfaces.

10. The system according to claim 9, wherein said gaps are air gaps substantially concentric with each other.

11. The system according to claim 9, wherein said first gap has a width in the range between about 40 to 60 microns, and said second gap has a width in the range between about 40 to 60 microns.

12. The system according to claim 9, wherein said optical system is a unit magnification system.

13. The system according to claim 9, wherein said plano-convex lens is calcium fluoride.

14. The system according to claim 9, wherein said plano-convex lens is lithium fluoride.

15. The system according to claim 9, wherein said first and second meniscus lenses are fused silica.

16. The system according to claim 9, wherein said first gap is a glass layer having an index of refraction that is lower than both said second meniscus lens and said plano-convex lens.

17. The system according to claim 16, wherein said second gap is a glass layer having an index of refraction that is lower than both said first meniscus lens and said second meniscus lens.

18. The system according to claim 9, wherein said first gap is a first glass layer having an index of refraction that is lower than both said second meniscus lens and said plano-convex lens, and said second gap is a second glass layer having an index of refraction that is lower than both said first meniscus lens and said second meniscus lens.

* * * * *